United States Patent [19]
Satoh et al.

[11] Patent Number: 5,585,167
[45] Date of Patent: Dec. 17, 1996

[54] THIN-FILM CONDUCTOR AND METHOD OF FABRICATING THE SAME

[75] Inventors: Toshifumi Satoh, Nara; Hideaki Adachi, Osaka; Yo Ichikakwa, Osaka; Kentaro Setsune, Osaka, all of Japan

[73] Assignee: Matsushita Electric Industrial Co., Ltd., Osaka, Japan

[21] Appl. No.: 52,966

[22] Filed: Apr. 27, 1993

[30] Foreign Application Priority Data

May 22, 1992 [JP] Japan ................................. 4-130398
May 18, 1992 [JP] Japan ................................. 4-124575

[51] Int. Cl.$^6$ ................................................. H01L 39/00
[52] U.S. Cl. .......................... 428/216; 428/336; 428/697; 428/701; 428/702
[58] Field of Search .................................. 428/697, 701, 428/702, 336, 216

[56] References Cited

U.S. PATENT DOCUMENTS 4,983,575 1/1991 Komuro et al. .............................. 525/1

OTHER PUBLICATIONS

Patent Abstract of Japan C0948 vol. 6, No. 249 Published Jun. 8, 1992.
Patent Abstract of Japan E1108 vol. 15, No. 351 Published Sep. 5, 1991.
Patent Abstract of Japan E0965 vol. 14, No. 380 Published Aug. 16, 1990.
Patent Abstract of Japan C1122 vol. 17 No. 577 Published Oct. 20, 1993.
Patent Abstract of Japan E748 vol. 13 No. 173 Published Apr. 24, 1989.
McGraw–Hill Encyclopedia of Science & Technology –7th Edition –pp. 300–308.
"The Parent Structure Of The Layered High–Temperature Superconductors" by T. Siegrist et al; Reprinted from Nature, vol. 334, No. 6179, pp., 231–232, 21 Jul. 1988.
"Superconductivity In The Ba–Sr–Cu–O System" by M. Takano et al; Physica C 176 (1991) pp., 441–444.
"Superconductivity at 110K In The Infinite–Layer Compound $(Sr_{1-x}Ca_x)_{1-y}CuO_2$"; by M Azuma et al; Nature, vol. 356, 30 Apr. 1992.
"ACuO$_2$ (A : Alkaline Earth) Crystallizing In A Layered Structure" by M. Takano et al.; Physica C 159 (1989) pp., 375–378.

Primary Examiner—Archene Turner
Attorney, Agent, or Firm—Lowe, Price, LeBlanc & Becker

[57] ABSTRACT

A thin-film conductor is made of $(Sr_{1-y}Ca_y)_{1-x}CuO_z$, wherein $0 \leq x \leq 0.1$ and $0 \leq y \leq 0.5$, and z is approximately equal to or smaller than 2. In a method of fabricating the thin-film conductor, it is preferably to heat a substrate. A first atomic layer of metal including Sr or including Sr and Ca is formed on the heated substrate. A second atomic layer of oxide containing Cu is formed on the first atomic layer. A first atomic layer of metal including Sr or including Sr and Ca is formed on the second atomic layer. These steps are repeated to form a lamination of an alternation of the first atomic layers and the second atomic layers on the substrate.

7 Claims, 4 Drawing Sheets

THIN-FILM CONDUCTOR AND METHOD OF FABRICATING THE SAME

BACKGROUND OF THE INVENTION

1. Field of the Invention

This invention relates to a thin-film conductor. This invention also relates to a method of fabricating a thin-film conductor.

2. Description of the Prior Art

In 1988, Roth and collaborators discovered the compound which is now known as the "all-layer phase" or the "parent structure" of all copper-oxide superconductors (T. Siegrist, S. M. Zahurak, D. W. Murphy, and R. S. Roth: Nature, Vol. 334, No. 6179, pp. 231–232, 1988). It is based on the infinite stacking of $CuO_2$ planes separated only by the alkaline earth atoms "A" in the stacking sequence $CuO_2$—A—$CuO_2$—A. . . . Specifically, they reported the growth of small single crystals of the composition $Ca_{0.84}Sr_{0.16}CuO_2$, and the characterization thereof by single-crystal X-ray diffraction. The crystals are tetragonal with space group P4/mmm, and the structure contains planer $[CuO_2]_\infty$ layers separated by Ca and Sr atoms.

Takano and coworkers discovered in 1989 that the all-layer phase could be stabilized for large alkaline earths by synthesis under high applied pressures (M. Takano, T. Takeda, H. Okada, M. Miyamoto, and K. Kusaka: Physica C 159, 375–378, 1989). They found that $SrCuO_2$ and even (Ba, Sr)$CuO_2$ solid solutions could be synthesized. Specifically, they reported the crystals of $SrCuO_2$, $Sr_{2/3}Ca_{1/3}CuO_2$, $Sr_{1/2}Ca_{1/2}CuO_2$, and $Sr_{1/3}Ca_{2/3}CuO_2$. Owing to the larger sizes of these alkaline earths, the lengths of the Cu-O bonds in the new materials were significantly larger than those in $Ca_{0.84}Sr_{0.16}CuO_2$.

Takano and coworkers reported the composition dependence of the lattice constants and the bond lengths of $ACuO_2$ upon the "A" cation radius where "A" denotes the alkaline earth atoms such as Sr, $Sr_{1/2}Ca_{1/2}$, or Ca (M. Takano, M. Azuma, Z. Hiroi, and Y. Bando: Physica C 176, 441–444, 1991).

Azuma and coworkers reported the infinite-layer compound $(Ca_{1-x}Sr_x)_{1-y}CuO_2$ where $0.4 \leq x \leq 0.7$ and $0 \leq y \leq 0.1$ (M. Azuma, Z. Hiroi, M. Takano, Y. Bando, and Y. Takeda: Nature, Vol. 356, pp. 775–776, April 1992). They also reported the compound $(Ca_{0.3}Sr_{0.7})_{0.9}CuO_{2-\delta}$ where $\delta > 0$.

It is known to make the composition $ACuO_2$ such as $Ca_{0.84}Sr_{0.16}CuO_2$ by sintering under high pressures. Powders of the composition of $ACuO_2$ are available through the sintering process. A thin film of the composition of $ACuO_2$ is unavailable. In some cases, thin-film conductors are suitable for use in various electric devices.

SUMMARY OF THE INVENTION

It is an object of this invention to provide a thin-film conductor of an $ACuO_2$-based composition.

It is another object of this invention to provide a reliable method of fabricating a thin-film conductor of an $ACuO_2$-based composition.

A first aspect of this invention provides a method of fabricating a thin-film conductor of $Sr_{1-x}CuO_z$, wherein $0 \leq x \leq 0.1$ and z is approximately equal to or smaller than 2, the method comprising the steps of (a) forming a first atomic layer of metal including Sr on a substrate; (b) forming a second atomic layer of oxide containing Cu on the first atomic layer; (c) forming a first atomic layer of metal including Sr on the second atomic layer; and (d) repeating the steps (b) and (c) to form a lamination of an alternation of the first atomic layers and the second atomic layers on the substrate.

A second aspect of this invention provides a method of fabricating a thin-film conductor of $(Sr_{1-y}Ca_y)_{1-x}CuO_z$, wherein $0 \leq x \leq 0.1$ and $0 < y \leq 0.5$, and z is approximately equal to or smaller than 2, the method comprising the steps of (a) forming a first atomic layer of metal including Sr and Ca on a substrate; (b) forming a second atomic layer of oxide containing Cu on the first atomic layer; (c) forming a first atomic layer of metal including Sr and Ca on the second atomic layer; and (d) repeating the steps (b) and (c) to form a lamination of an alternation of the first atomic layers and the second atomic layers on the substrate.

A third aspect of this invention provides a method of fabricating a thin-film conductor of $(Sr_{1-y}Ca_y)_{1-x}CuO_z$, wherein $0 \leq x \leq 0.1$ and $0 \leq y \leq 0.5$, and z is approximately equal to or smaller than 2, the method comprising the steps of (a) forming a first-type layer of metal including Sr or including Sr and Ca on a substrate, the first-type layer having a thickness corresponding to one atom; (b) after the step (a), forming a second-type layer of oxide containing Cu on the first-type layer, the second-type layer having a thickness corresponding to one atom; (c) after the step (b), forming a first-type layer of metal including Sr or including Sr and Ca on the second-type layer, the first-type layer having a thickness corresponding to one atom; and (d) after the step (c), repeating the steps (b) and (c) to form a lamination of an alternation of the first-type layers and the second-type layers on the substrate.

A fourth aspect of this invention provides a conductor comprising a thin-film body of a single crystal, the thin-film body including a lamination of an alternation of first-type layers and second-type layers, the first-type layers each consisting of a plane of Sr or Sr and Ca which has a thickness corresponding to one atom, the second-type layers each consisting of a plane of $CuO_2$ which has a thickness corresponding to one atom.

DESCRIPTION OF THE PREFERRED EMBODIMENTS

Figure 1:
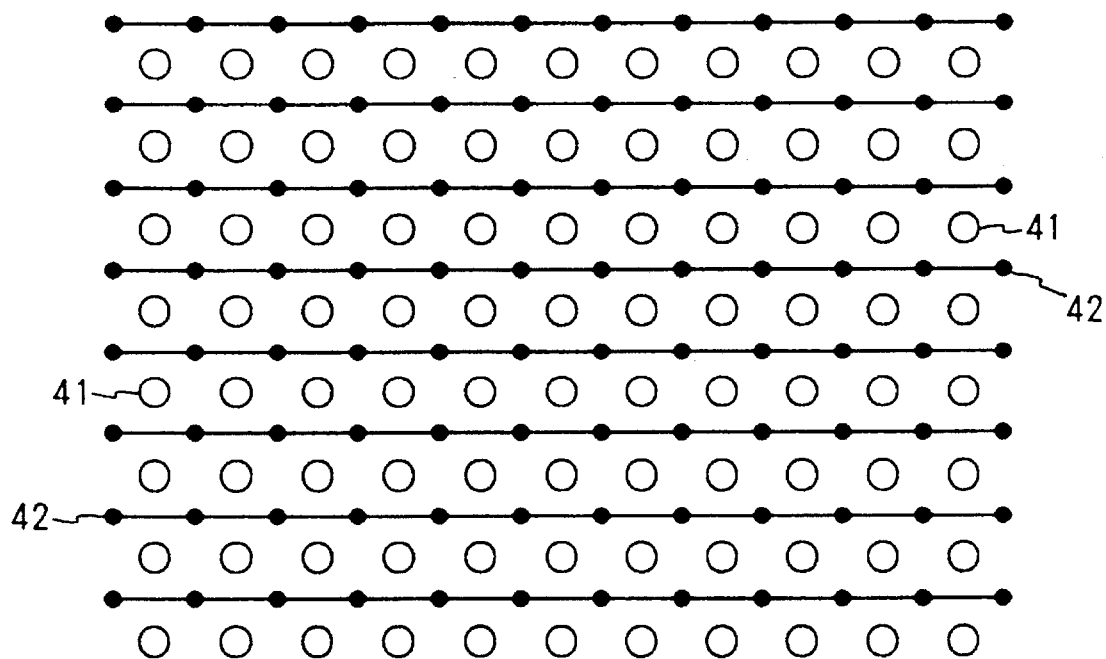
FIG. 1 is a diagram of the structure of a thin-film conductor according to an embodiment of this invention.

First, a basic embodiment of this invention will be described. An apparatus for fabricating a thin-film conductor has a chamber under a high vacuum. A substrate is disposed in the vacuum chamber. The substrate can be heated by a suitable heating device. Sources of first and second materials to be evaporated are also placed in the vacuum chamber. The first material includes metal having at least alkaline earth atoms. The second material includes Cu atoms.

First atomic layers including the alkaline earth metal and second atomic layers including oxide containing Cu are alternately laminated or formed on the substrate by activating the sources of the first and second materials. Specifically, the substrate is heated by the heating device. In addition, the first and second materials are vaporized and radiated from the sources as a result of the activation of the sources. Some of the vaporized materials reach the heated substrate and deposit thereon. A process of oxidizing Cu is executed to obtain the oxide containing Cu.

The fabricating apparatus has sections for detecting the mounts of the first and second materials vaporized from the sources to estimate or measure the thickness of each first atomic layer and the thickness of each second atomic layer respectively.

The fabricating apparatus includes movable shutters which are disposed within the vacuum chamber. The shutters are located between the substrate and the sources of the first and second materials to selectively block and unblock travel of the first and second materials to the substrate. The shutters are controlled in response to the detected amounts of the first and second vaporized materials to finely adjust the formation of each first atomic layer and the formation of each second atomic layer on the substrate respectively.

The alternately-laminated first and second atomic layers compose a thin-film conductor of a single crystal.

In the thin-film conductor, each of the first and second atomic layers has a thickness corresponding to one atom or one inter-atom spacing. Thus, the layers are referred to as the "atomic" layers. In some cases, the layers are also referred to as the "planes" or the "single planes".

Laminating or forming the first and second atomic layers on the substrate may be executed by molecular beam epitaxy (MBE). According to MBE, since a back pressure corresponds to a very high vacuum, the amount of impurity which is present as gas atmosphere is small. Therefore, MBE enables the formation of a thin-film conductor having only a very small density of impurity.

A general embodiment of this invention will now be described. According to the general embodiment, a substrate is disposed in a vacuum chamber or a vacuum container. The substrate can be heated by a suitable heating device. In addition, a source of Sr metal material to be evaporated is placed in the vacuum chamber. Also, a source of Ca metal material to be evaporated is placed in the vacuum chamber. Further, a source of Cu metal material is placed in the vacuum chamber. Sensing devices such as quartz crystal rate monitors are provided which detect the rates of vaporization of Sr, Ca, and Cu from the sources to estimate or measure the thicknesses of resultant atomic layers on the substrate respectively. Movable shutters are disposed within the vacuum chamber. The shutters are located between the substrate and the Sr, Ca, and Cu sources to selectively block and unblock travel of Sr, Ca, and Cu to the substrate. A gas beam generator serves to radiate gas containing oxygen radicals toward a region at and around the substrate. A sensor preferably located near one of the sources and the gas beam generator detects the pressure within the chamber. The chamber is exposed to a vacuum which can be adjusted by a suitable vacuum control mechanism including, for example, a vacuum-generating pump.

A thin-film conductor was fabricated as follows. The substrate remained heated by the heating device. The source of Sr metal material and the source of Ca metal material were activated so that Sr and Ca atoms were vaporized therefrom. Some of the vaporized Sr and Ca atoms reached the heated substrate, and consequently an atomic layer or a single plane including Sr and Ca deposited on the substrate. During the activation of the Sr and Ca sources, the rates of vaporization of Sr and Ca from the sources were detected by the sensing devices, and the related shutters were controlled in response to the detected rates of vaporization of Sr and Ca. The control of the shutters was designed so that the amount of vaporized Sr and Ca was equal to a predetermined mount which corresponded to the one-atom (one inter-atom spacing) thickness of the atomic layer on the substrate. After the formation of the atomic layer including Sr and Ca was completed, the source of Cu metal material and the gas beam generator were activated so that Cu atoms were vaporized from the related source and the oxygen radicals were radiated from the gas beam generator toward the region at and around the substrate. Some of the vaporized Cu atoms and the oxygen atoms reached the previously-formed atomic layer including Sr and Ca, and consequently an atomic layer or a single plane including oxide containing Cu deposited on the previously-formed atomic layer including Sr and Ca. During the activation of the Cu source, the rate of vaporization of Cu from the source was detected by the sensing device, and the related shutter was controlled in response to the detected rate of vaporization of Cu. The control of the shutter was designed so that the mount of vaporized Cu was equal to a predetermined amount which corresponded to the one-atom (one inter-atom spacing) thickness of the atomic layer on the substrate. After the formation of the atomic layer including the oxide containing Cu was completed, the source of Sr metal material and the source of Ca metal material were activated so that Sr and Ca atoms were vaporized therefrom. Some of the vaporized Sr and Ca atoms reached the previously-formed atomic layer including the oxide containing Cu, and consequently an atomic layer or a single plane including Sr and Ca deposited on the previously-formed atomic layer including the oxide containing Cu. During the activation of the Sr and Ca sources, the rates of vaporization of Sr and Ca from the sources were detected by the sensing devices, and the related shutters were controlled in response to the detected rates of vaporization of Sr and Ca. The control of the shutters was designed so that the amount of vaporized Sr and Ca was equal to a predetermined amount which corresponded to the one-atom (one inter-atom spacing) thickness of the atomic layer on the substrate.

The previously-mentioned processes were periodically reiterated so that the atomic layers including Sr and Ca and the atomic layers including the oxide containing Cu were alternately laminated or formed on the substrate. The alternately-laminated atomic layers composed a thin-film conductor of a single crystal. During the fabrication of the thin-film conductor, the pressure sensor and the vacuum control mechanism were used to maintain the vacuum in the chamber at a level in the range of $10^{-6}$ Torr to $10^{-4}$ Torr. It was most preferable that the pressure in the chamber was equal to about $10^{-5}$ Torr. During the fabrication of the thin-film conductor, the temperature of the substrate was preferably maintained at a value in the range of 600° C. to 650° C. Regarding the goodness of crystalline characteristics of the thin-film conductor, it was most preferable that the temperature of the substrate was maintained in the rage of 620° C. to 630° C.

It should be noted that the gas beam generator may be continuously activated during the fabrication of the thin-film conductor. Even in this case, Sr and Ca atoms were hardly oxidized by oxygen radicals while only Cu atoms were oxidized thereby.

The formation of the alternately laminated structure of the atomic layers including Sr and Ca and the atomic layers including the oxide containing Cu was executed in molecular beam epitaxy (MBE). It should be noted that other methods such as electron-beam vapor deposition or sputtering may be used instead of MBE. According to MBE, oxygen radicals were radiated toward the region at and around the substrate, and Cu atoms were oxidized by the oxygen radicals to form the atomic layer including the oxide containing Cu. The oxygen radicals were generated in a suitable way such as a way in which a high-frequency discharge tube filled with oxygen gas was activated so that oxygen gas was converted into oxygen radicals. It should be noted that ozone gas or $NO_2$ gas may be used instead of oxygen radicals. As previously described, during the execution of MBE, the vacuum in the chamber was preferably maintained at a level in the range of $10^{-6}$ Torr to $10^{-4}$ Torr. It was most preferable that the pressure in the chamber was equal to about $10^{-5}$ Torr. During the execution of MBE, the temperature of the substrate was preferably maintained at a value in the range of 600° C. to 650° C. Regarding goodness of crystalline characteristics of the thin-film conductor, it was most preferable that the temperature of the substrate was maintained in the rage of 620° C. to 630° C.

The thin-film conductor included a single crystal. It is believed that the crystal has a structure such as shown in FIG. 1. In FIG. 1, small circles 42 in a row denote Cu atoms in the oxide which composes an atomic layer or a single plane. In addition, large circles 41 in a row denote Sr and Ca atoms which compose an atomic layer or a single plane. As shown in FIG. 1, the atomic layers including the oxide containing Cu and the atomic layers including Sr and Ca are alternately laminated. It is believed that the atomic layers including the oxide containing Cu are single $CuO_2$ planes which are separated by single planes of Sr and Ca. The crystal can be expressed by the molecular formula as $(Sr_{1-y}Ca_y)_{1-x}CuO_z$ where "y" denotes an atomic fraction determining the ratio in number between Sr and Ca, and "x" and "z" denote values depending on the densities of vacancies or defects. Generally, the value "z" is equal to or slightly smaller than 2. According to the results of experiments on various samples of the thin-film conductor, it is preferable that $0 \leq x \leq 0.1$. The atomic fraction "y" was varied by changing the ratio between the rate of vaporization of Sr and the rate of vaporization of Ca. According to the results of experiments on various samples of the thin-film conductor, it is preferable that $0 \leq y \leq 0.5$. In addition, it is most preferable that $0.25 \leq y \leq 0.35$. It is best that "y" equals about 0.3.

It should be noted that the source of Ca metal material may be omitted. In this case, the crystal of a resultant thin-film conductor can be expressed by the molecular formula as $Sr_{1-x}CuO_z$. In addition, the crystal has a structure such that atomic layers including Sr and atomic layers including oxide containing Cu are alternately laminated. In the thin-film conductor of $Sr_{1-x}CuO_z$, the value "z" is generally equal to or slightly smaller than 2 while the value "x" is preferably in the rage of 0 to 0.1.

Figure 2:
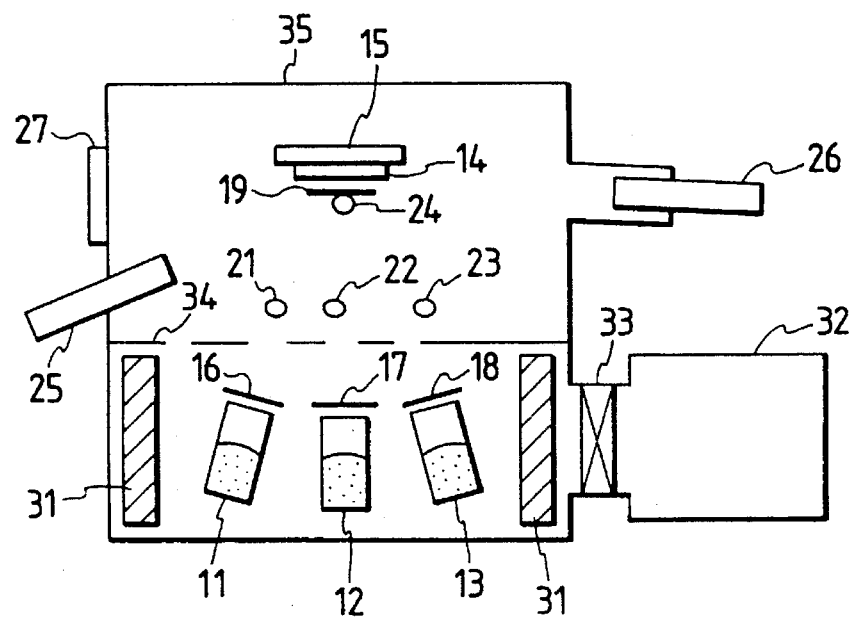
FIG. 2 is a diagram of a fabricating apparatus.

A specific embodiment of this invention will now be described. With reference to FIG. 2, a fabricating apparatus includes a vacuum container 35, the interior of which is divided by a partition wall 34 into upper and lower chambers. The partition wall 34 has openings via which the upper and lower chambers communicate with each other. The lower chamber is connected to a vacuum-generating pump 32 via a gate valve 33. The pressure within the container 35 can be adjusted by controlling the vacuum-generating pump 32. A liquid-nitrogen shroud 31 extends in the lower chamber.

Knudsen cells 11, 12, and 13 are disposed in the lower chamber. The Knudsen cell 11 contains a source of Sr metal material to be evaporated. The Knudsen cell 12 contains a source of Ca metal material to be evaporated. The Knudsen cell 13 contains a source of Cu metal material to be evaporated.

A RHEED gun 26 and a RHEED screen 27 are provided at opposite sides of the upper chamber respectively. A substrate 14 disposed in the upper chamber includes a single crystal of strontium titanate, the (100) plane of which faces downward and is exposed. The substrate 14 can be heated by a heater 15.

Sr atoms cam be vaporized from the Sr source 11, and some of the vaporized Sr atoms can pass through the opening in the partition wall 34 before reaching the substrate 14. A movable shutter 16 located in front of the Sr source 11 selectively blocks and unblocks travel of Sr atoms from the Sr source 11 to the substrate 14. A quartz crystal rate monitor 21 for film rate control is located at a position within the upper chamber which can be exposed to a beam of vaporized Sr atoms. The quartz crystal rate monitor 21 outputs signals having given relations with the rate of deposition of Sr on the substrate 14 and the amount of Sr atoms deposited thereon.

Ca atoms can be vaporized from the Ca source 12, and some of the vaporized Ca atoms can pass through the opening in the partition wall 34 before reaching the substrate 14. A movable shutter 17 located in front of the Ca source 12 selectively blocks and unblocks travel of Ca atoms from the Ca source 12 to the substrate 14. A quartz crystal rate monitor 22 for film rate control is located at a position within the upper chamber which can be exposed to a beam of vaporized Ca atoms. The quartz crystal rate monitor 22 outputs signals having given relations with the rate of deposition of Ca on the substrate 14 and the amount of Ca atoms deposited thereon.

Cu atoms can be vaporized from the Cu source 13, and some of the vaporized Cu atoms can pass through the opening in the partition wall 34 before reaching the substrate 14. A movable shutter 18 located in front of the Cu source 13 selectively blocks and unblocks travel of Cu atoms from the Cu source 13 to the substrate 14. A quartz crystal rate monitor 23 for film rate control is located at a position within the upper chamber which can be exposed to a beam of vaporized Cu atoms. The quartz crystal rate monitor 23 outputs signals having given relations with the rate of deposition of Cu on the substrate 14 and the amount of Cu atoms deposited thereon.

A movable shutter 19 located in front of the substrate 14 serves to selectively block and unblock the application of beams of vaporized Sr, Ca, and Cu atoms to the substrate 14. A quartz crystal rate monitor 24 is located at a position within the upper chamber which can be exposed to the beams of vaporized Sr, Ca, and Cu atoms. The quartz crystal rate monitor 24 outputs signals representing the rates of vaporization of Sr, Ca, and Cu atoms and the amounts of vaporized Sr, Ca, and Cu atoms.

A gas beam generator 25 provided at a side of the upper chamber serves to emit a beam of oxygen radicals toward a region at and around the substrate 14. A sensor (not shown) preferably located near one of the sources 16, 17, and 18, and the gas beam generator 25 detects the pressure within the container 35.

A thin-film conductor was made by using the fabricating apparatus as follows. The Knudsen cell containing the Sr source 11 was continuously heated by a heater (not shown).

Thus, Sr atoms were vaporized and radiated from the source 11. A temperature feedback control loop includes a sensor for detecting the temperature of the Knudsen cell, and a device for adjusting a drive current to the heater in response to the detected temperature of the Knudsen cell. The temperature feedback control loop was designed so that the temperature of the Knudsen cell containing the Sr source 11 was maintained at essentially a predetermined temperature equal to, for example, 575° C.

The Knudsen cell containing the Ca source 12 was continuously heated by a heater (not shown). Thus, Ca atoms were vaporized and radiated from the source 12. A temperature feedback control loop includes a sensor for detecting the temperature of the Knudsen cell, and a device for adjusting a drive current to the heater in response to the detected temperature of the Knudsen cell. The temperature feedback control loop was designed so that the temperature of the Knudsen cell containing the Ca source 12 was maintained at essentially a predetermined temperature equal to, for example, 585° C.

The Knudsen cell containing the Cu source 13 was continuously heated by a heater (not shown). Thus, Cu atoms were vaporized and radiated from the source 13. A temperature feedback control loop includes a sensor for detecting the temperature of the Knudsen cell, and a device for adjusting a drive current to the heater in response to the detected temperature of the Knudsen cell. The temperature feedback control loop was designed so that the temperature of the Knudsen cell containing the Cu source 13 was maintained at essentially a predetermined temperature equal to, for example, 1,150° C.

The substrate 14 was continuously heated by the heater 15. A temperature feedback control loop includes a sensor for detecting the temperature of the substrate 14, and a device for adjusting a drive current to the heater 15 in response to the detected temperature of the substrate 14. The temperature feedback control loop was designed so that the temperature of the substrate 14 was maintained at essentially a predetermined temperature equal to, for example, about 675° C.

The gas beam generator 25 was continuously activated so that a beam of oxygen radicals was emitted from the generator 25 toward a region at and around the substrate 14. The vacuum-generating pump 32 was continuously activated. The degree of activation of the gas beam generator 25, that is, the intensity of the beam of oxygen radicals, was controlled in response to the output signal of the pressure sensor so that the pressure within the container 35 was maintained in the range of $10^{-6}$ Torr to $10^{-4}$ Torr.

Initially, the shutter 19 was closed while the shutters 16, 17, and 18 were open. The shutter 19 remained closed until the quartz crystal rate monitor 24 detected that beams of Sr, Ca, and Cu atoms were emitted from the sources 11, 12, and 13 at sufficient levels. Then, the shutter 18 was closed and the shutter 19 was opened, and the shutters 16 and 17 were continued to be open. Thus, the substrate 14 was exposed to beams of Sr and Ca atoms vaporized from the sources 11 and 12. The amount of Sr and Ca atoms deposited on the substrate 14 was estimated by referring to the output signals of the quartz crystal rate monitors 21 and 22. When the estimated amount of Sr and Ca atoms reached a predetermined amount which corresponded to the formation of an atomic layer with a one-atom (one inter-atom spacing) thickness, the shutters 16 and 17 were closed. Thus, the atomic layer of a one-atom (one inter-atom spacing) thickness which included Sr and Ca was formed on the substrate 14. The exposure of the substrate 14 to the beams of Sr and Ca atoms was continued during, for example, 10 seconds. During a subsequent period of, for example, 10 seconds, the shutters 16, 17, and 18 remained closed. Then, the shutter 18 was opened, and the shutters 16 and 17 were continued to be closed. Therefore, the substrate 14, on which the atomic layer including Sr and Ca was formed, was exposed to a beam of Cu atoms. The Cu atoms and the oxygen radicals composed oxide which deposited on the previously-formed atomic layer including Sr and Ca. The amount of Cu atoms deposited on the previously-formed atomic layer was estimated by referring to the output signal of the quartz crystal rate monitor 23. When the estimated amount of Cu atoms reached a predetermined mount which corresponded to the formation of an atomic layer with a one-atom (one inter-atom spacing) thickness, the shutter 18 was closed. Thus, the atomic layer of a one-atom (one inter-atom spacing) thickness which included the oxide containing Cu was formed on the previously-formed atomic layer including Sr and Ca. The exposure of the substrate 14 to the beam of Cu atoms was continued during, for example, 15 seconds. During a subsequent period of, for example, 10 seconds, the shutters 16, 17, and 18 remained closed. Then, the shutters 16 and 17 were opened, and the shutter 18 continued to be closed. Thus, the substrate 14, on which the atomic layer including the oxide containing Cu was formed, was exposed to beams of Sr and Ca atoms vaporized from the sources 11 and 12. Thus, Sr and Ca atoms deposited on the previously-formed atomic layer including the oxide containing Cu. The mount of Sr and Ca atoms deposited on the previously-formed atomic layer was estimated by referring to the output signals of the quartz crystal rate monitors 21 and 22. When the estimated mount of Sr and Ca atoms reached a predetermined amount which corresponded to the formation of an atomic layer with a one-atom (one inter-atom spacing) thickness, the shutters 16 and 17 were closed. Thus, the atomic layer of a one-atom (one inter-atom spacing) thickness which included Sr and Ca was formed on the previously-formed atomic layer including the oxide containing Cu. The exposure of the substrate 14 to the beams of Sr and Ca atoms was continued during, for example, 10 seconds. During a subsequent period of, for example, 10 seconds, the shutters 16, 17, and 18 remained closed.

Figure 3:
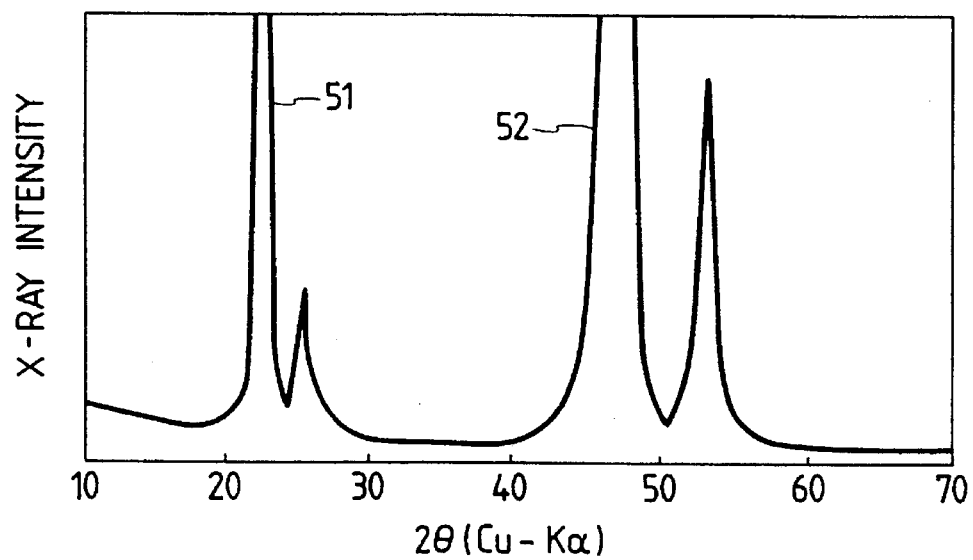
FIG. 3 is a diagram of an X-ray diffraction pattern of a sample of a thin-film conductor according to an embodiment of this invention.

The previously-mentioned processes of forming the atomic layer including Sr and Ca and the atomic layer including the oxide containing Cu were reiterated 40 times so that a thin-film conductor having a thickness of 140 angstroms was formed on the substrate 14. Experiments on samples of the resultant thin-film conductor revealed that the ratio in number between Cu atoms and a sum of Sr and Ca atoms, that is, (Sr, Ca):Cu, in each sample was 1:1. FIG. 3 shows an X-ray diffraction pattern of a sample of the resultant thin-film conductor. In FIG. 3, the numerals 51 and 52 denote intensity peaks which are caused by the crystal of strontium titanate constituting the substrate 14. The ratio in number between Sr and Ca atoms was varied in accordance with the relation between the temperatures at which the Knudsen cells containing the Sr source 11 and the Ca source 12 were heated. Regarding the goodness of crystalline characteristics of the thin-film conductor, it was most preferable that Sr atoms and Ca atoms were 70% and 30% in number respectively.

Figure 4:
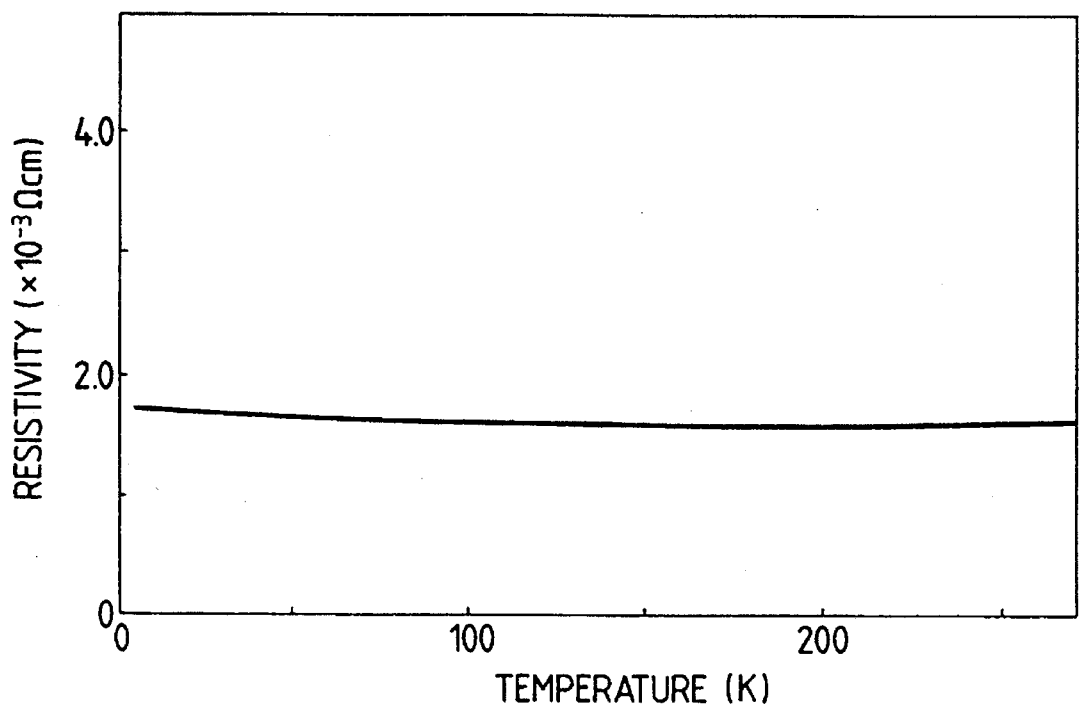
FIG. 4 is a diagram of a resistivity-temperature characteristic of a sample of a thin-film conductor according to an embodiment of this invention.

FIG. 4 shows the result of measurement of the resistivity-temperature characteristic of a sample of the resultant thin-film conductor which has a c-axis length of 3.6 angstroms. As shown in FIG. 4, the resistivity of the sample of the thin-film conductor is approximately constant independent of the temperature in the range of 10K to 270K.

The fabricating apparatus will be further described. The shutters 16, 17, and 18 are driven by pneumatic actuators (not shown) respectively. The pneumatic actuators are connected to different-pressure sources via electromagnetic valves. As the electromagnetic valves are controlled, the pneumatic actuators are operated so that the shutters 16, 17, and 18 are driven respectively.

Figure 5:
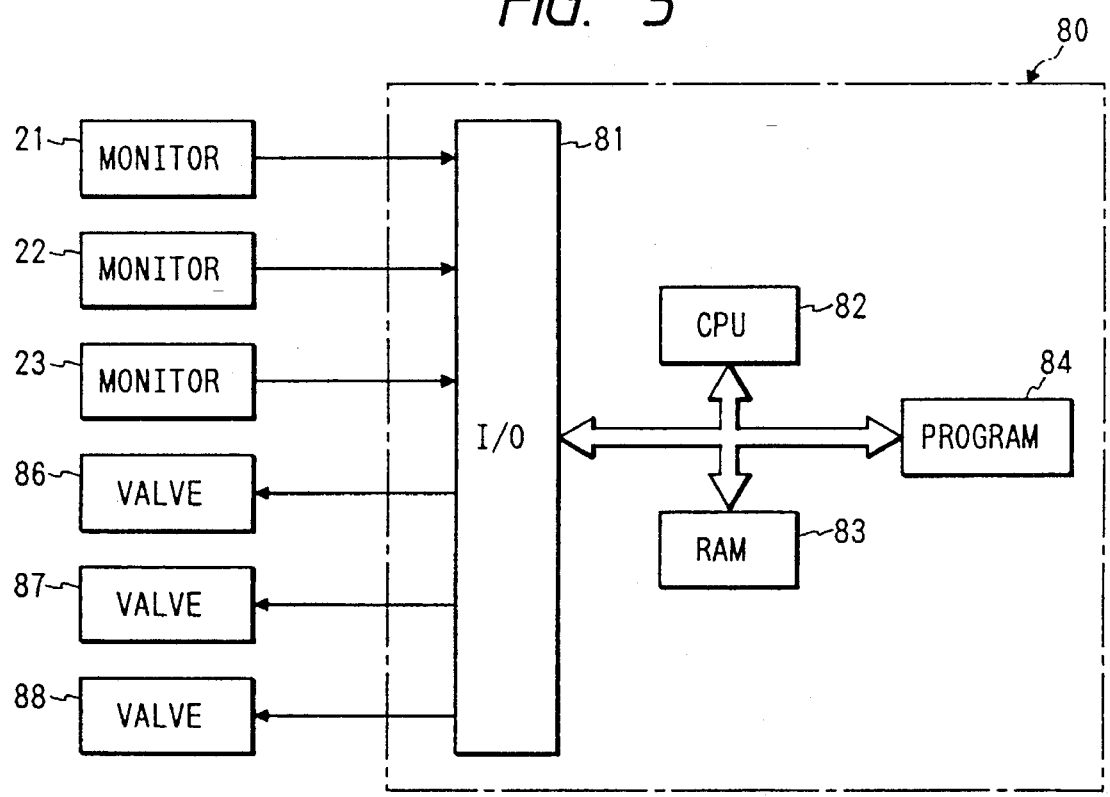
FIG. 5 is a block diagram of an electric part of the fabricating apparatus.

The fabricating apparatus includes a controller having a microcomputer 80. As shown in FIG. 5, the microcomputer 80 includes a combination of an I/O port 81, a CPU 82, a RAM 83, and a program memory 84. The I/O port 81 is connected to the quartz crystal rate monitors 21, 22, and 23 to receive the output signals thereof. The I/O port 81 is connected to the electromagnetic valves 86, 87, and 88 associated with the shutters 16, 17, and 18 respectively. The microcomputer 80 generates valve control signals on the basis of the output signals of the quartz crystal rate monitors 21, 22, and 23, and feeds the generated valve control signals to the electromagnetic valves 86, 87, and 88 via the I/O port 81 respectively. The electromagnetic valves 86, 87, and 88 are controlled by the valve control signals respectively.

Figure 6:
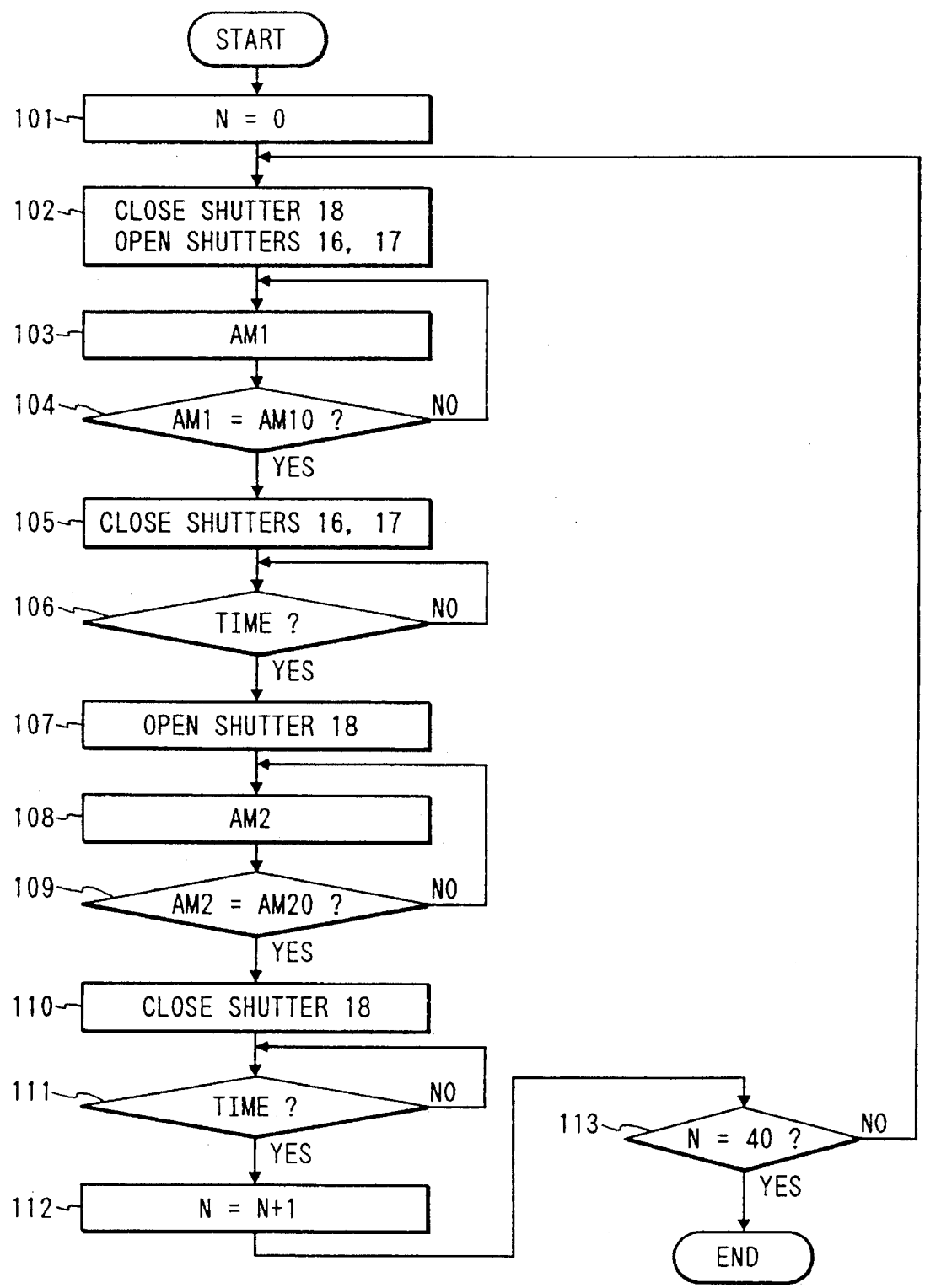
FIG. 6 is a flowchart of a segment of a program for controlling the microcomputer in FIG. 5.

The microcomputer 80 operates in accordance with a program stored in the program memory 84. FIG. 6 is a flowchart of a segment of the program.

As shown in FIG. 6, a first step 101 of the program segment initializes the variable "N" to "O". After the step 101, the program advances to a step 102 which controls the electromagnetic valves 86, 87, and 88 so that the shutters 16 and 17 are open but the shutter 18 is closed. Thus, beams of vaporized Sr and Ca atoms start to be applied to the substrate 14. After the step 102, the program advances to a step 103 which derives information of the mount AM1 of vaporized Sr and Ca atoms from the current output signals of the quartz crystal rate monitors 21 and 22. A step 104 following the step 103 compares the amount AM1 with a predetermined amount AM10 which corresponds to the formation of an atomic layer with a one-atom (one inter-atom spacing) thickness. When the amount AM1 is smaller than the predetermined mount AM10, the program returns to the step 103. When the mount AM1 reaches the predetermined amount AM10, the program advances to a step 105. As a result, the shutters 16 and 17 remain open and hence the beams of vaporized Sr and Ca atoms continue to be applied to the substrate 14 until the mount AM1 reaches the predetermined amount AM10.

The step 105 controls the electromagnetic valves 86 and 87 so that the shutters 16 and 17 are closed. Thus, all the shutters 16, 17, and 18 are closed. After the step 105, the program advances to a step 106 which decides whether or not a predetermined time, for example, 10 seconds, has elapsed since the moment of closing the shutters 16 and 17 by the step 105. When the predetermined time has not yet elapsed, the step 106 is reiterated. When the predetermined time has elapsed, the program advances to a step 107. As a result, the shutters 16, 17, and 18 remain closed during the predetermined time.

The step 107 controls the electromagnetic valve 88 so that the shutter 18 is open. Thus, the shutter 18 is open but the shutters 16 and 17 continue to be closed. As a result, a beam of vaporized Cu atoms starts to be applied toward the substrate 14. After the step 107, the program advances to a step 108 which derives information of the amount AM2 of vaporized Cu atoms from the current output signal of the quartz crystal rate monitor 23. A step 109 following the step 108 compares the amount AM2 with a predetermined amount AM20 which corresponds to the formation of an atomic layer with a one-atom (one inter-atom spacing) thickness. When the amount AM2 is smaller than the predetermined amount AM20, the program returns to the step 108. When the amount AM2 reaches the predetermined amount AM20, the program advances to a step 110. As a result, the shutter 18 remains open and hence the beam of vaporized Cu atoms continue to be applied toward the substrate 14 until the amount AM2 reaches the predetermined amount AM20.

The step 110 controls the electromagnetic valve 88 so that the shutter 18 is closed. Thus, all the shutters 16, 17, and 18 are closed. After the step 110, the program advances to a step 111 which decides whether or not a predetermined time, for example, 10 seconds, has elapsed since the moment of closing the shutter 18 by the step 110. When the predetermined time has not yet elapsed, the step 111 is reiterated. When the predetermined time has elapsed, the program advances to a step 112. As a result, the shutters 16, 17, and 18 remain closed during the predetermined time.

The step 112 increments the number "N" by "1". A step 113 following the step 112 compares the number "N" with a predetermined number, for example, 40. When the number "N" is smaller than the predetermined number, the program returns to the step 102. When the number "N" reaches the predetermined number, the program segment ends. As a result, the previously-mentioned sequence of the steps is reiterated the predetermined number of times.

What is claimed is:

1. A conductor comprising a thin-film body of a single crystal, the thin-film body including a lamination of alternating first and second layers, the first layers each consisting of a plane of Sr or Sr and Ca which has a thickness corresponding to one atom and the second layers each consisting of a plane of $CuO_2$ which has a thickness corresponding to one atom, the first layers each being devoid of oxygen.

2. The conductor of claim 1 which has a resistivity approximately constant in a temperature range of 10K to 270K.

3. The conductor of claim 1 wherein first and second layers total about 40.

4. The conductor of claim 1 wherein said thin-film body has a thickness of about 140 Angstroms.

5. The conductor of claim 1 further comprising a substrate with said thin-film body formed thereon.

6. A conductor comprising a thin-film body of a single crystal, the thin-film body including a lamination of alternating first and second layers, the first layers each consisting of a plane of Sr or Sr and Ca which has a thickness corresponding to one atom and the second layers each consisting of a plane of $CuO_2$ which has a thickness corresponding to one atom, the first layers each being devoid of oxygen; wherein first and second layers total about 40 and said thin-film body has a thickness of about 140 Angstroms.

7. The conductor of claim 6 further comprising a substrate with said thin-film body formed thereon.

\* \* \* \* \*